(12) United States Patent
Oberlander et al.

(10) Patent No.: US 6,524,775 B1
(45) Date of Patent: Feb. 25, 2003

(54) EDGE BEAD REMOVER FOR THICK FILM PHOTORESISTS

(75) Inventors: Joseph E. Oberlander, Phillipsburg, NJ (US); Craig Traynor, Plainfield, NJ (US); Ernesto S. Sison, West Palm Beach, FL (US); Jeff Griffin, Mesa, AZ (US)

(73) Assignee: Clariant Finance (BVI) Limited (VG)

( * ) Notice: Subject to any disclaimer, the term of this patent is extended or adjusted under 35 U.S.C. 154(b) by 29 days.

(21) Appl. No.: 09/693,215

(22) Filed: Oct. 20, 2000

(51) Int. Cl.$^7$ .............................. G03F 7/16; G03F 7/42; B08B 3/04
(52) U.S. Cl. ....................... 430/327; 430/322; 430/331; 427/240; 427/273; 134/1.3; 134/33; 134/38
(58) Field of Search ................................ 430/322, 327, 430/331; 134/1.3, 33, 38; 427/240, 273

(56) References Cited

U.S. PATENT DOCUMENTS

| | | | |
|---|---|---|---|
| 5,122,440 A | * 6/1992 | Chien | 430/315 |
| 5,151,219 A | 9/1992 | Salamy et al. | 252/364 |
| 5,362,608 A | * 11/1994 | Flaim et al. | 430/327 |
| 5,814,433 A | * 9/1998 | Nelson et al. | 430/326 |

FOREIGN PATENT DOCUMENTS

| | | |
|---|---|---|
| JP | 11-202479 | 7/1999 |
| JP | 11-202492 | 7/1999 |
| JP | 11-218937 | 7/1999 |
| WO | WO 89/06378 | 7/1989 |

OTHER PUBLICATIONS

English translation of JP 11–218937, Shigehiro, Maeda, "Cleaning and removing solvent of resist and production of base body of electronic parts", Aug. 1999.*

Derwent Abstract, JP 11202492–A, "Coating Composition for Positive Resist—Contains Ester Carbonate as Solvent and Uses Alkaline Developer to Form Pattern".

CALPUS Abstract for Patent JP—11202479, "Coating Composition for Positive–Working Photoresist and Positive Resist Pattern Formation".

Derwent Abstract for Japanese Patent JP 11202479 "Coating Composition for Positive Photoresist—Contains Alkali–Soluble Resin and Quinone Diazide Group–Containing Compound Dissolved in Organic Solvent Containing Ester Carbonate".

WPIDS Abstract for Japanese Patent JP 11202479 "Coating Composition for Positive Photoresist—Contains Alkali–Soluble Resin and Quinone Diazide Group–Containing Compound Dissolved in Organic Solvent Containing Ester Carbonate".

CALPUS Abstract for Japanese Patent JP—11218937 "Solvent for Cleaning and Removal of Resists and Manufacture of Substrate for Electronic Parts Using the Solvent".

WPIDS Abstract for Japanese Patent JP—11218937 "Solvent Containing Carbonic Ester—Used for Cleaning and Removing Resists".

Christensen, Lorna D et al, "Evaluation and verification of improved edgebead removal process of improved edgebead removal process in CMOS production", XP–008004602, SPIE, vol. 2438/753 –758.

Maurizio Selva et al, The Addition Reaction of Dialkyl Carbonates to Ketones (*), XP–008002145, Gazzetta Chimica Italiana, 123, 1993, pp. 515–518.

Joseph Oberlander et al, Development of an Edge Bead Remover (EBR) for thick films, XP–008004601, SPIE, vol. 4345 (2001), pp. 475–483.

International Search Report.

* cited by examiner

Primary Examiner—Mark F. Huff
Assistant Examiner—Nicole Barreca
(74) Attorney, Agent, or Firm—Andrew F. Sayko, Jr.; Krishna G. Banerjee

(57) ABSTRACT

An edge bead remover for a photoresist composition disposed as a film on a surface, consisting essentially of a solvent mixture comprising from about 50 to about 80 parts by weight, based on the weight of the solvent mixture, of at least one di($C_1$–$C_3$)alkyl carbonate and from about 20 to about 50 parts by weight, based on the weight of the solvent mixture, of cyclopentanone. A method is also provided for treating a photoresist composition film disposed on a surface which method comprises contacting the photoresist composition with a solvent mixture, in an amount sufficient to produce a substantially uniform film thickness of the photoresist composition across the surface, wherein the solvent mixture comprises from about 50 to about 80 parts by weight, based on the weight of the solvent mixture, of at least one di($C_1$–$C_3$)alkyl carbonate and from about 20 to about 50 parts by weight, based on the weight of the solvent mixture, of cyclopentanone.

18 Claims, No Drawings

EDGE BEAD REMOVER FOR THICK FILM PHOTORESISTS

BACKGROUND OF THE INVENTION

The present invention relates generally to the field of radiation sensitive positive and negative photoresist compositions, such as compositions containing novolak resins or vinyl phenol resins as the film forming binder resin, together with a photosensitizer, such as an acid generator, which can be e.g., a naphthoquinone diazide or an onium salt sensitizing agent. It is well known in the art to produce positive photoresist formulations such as those described in U.S. Pat. Nos. 3,666,473, 4,115,128 and 4,173,470. These include alkali-soluble phenol-formaldehyde novolak resins together with light-sensitive materials, usually a substituted naphthoquinone diazide compound. The resins and sensitizers are dissolved in an organic solvent or mixture of solvents and are applied as a thin film or coating onto a substrate suitable for the particular application desired.

The film-forming component of these photoresist formulations (and the photoresist formation) upon being coated on a suitable substrate is initially insoluble in an alkaline aqueous solution. Upon exposure of selected areas of the coated substrate to a selected wavelength of actinic radiation, however, the photosensitive component undergoes a radiation induced structural transformation and thereby renders the exposed areas of the photoresist coating more soluble in an aqueous alkaline solution than the unexposed areas (for a positive photoresist). The relief pattern of the photoresist on the substrate produced by this method is useful for applications including use as an exposure mask or a pattern such as is employed in the manufacture of miniaturized integrated electronic components. In many industrial applications, particularly in the manufacture of miniaturized electronic components, a photoresist is required to provide a high degree of resolution for line and space widths on the order of one half to one-quarter micron (micrometer) or less.

The ability of a photoresist to reproduce these very small dimensions, on the order of one half micrometer or less, is extremely important in the production of large-scale integrated circuits on silicon chips and similar components. Circuit density on such a chip can only be increased, assuming photolithography techniques are utilized, by increasing the resolution capabilities of the resist to provide smaller and smaller lines and spaces. Negative photoresists, wherein the exposed areas of resist coating become insoluble and the unexposed areas are dissolved away by the developer, have been extensively used for this purpose by the semiconductor industry. However, positive photoresists generally have inherently higher resolution and have been widely utilized as replacements for many negative resists in the production of advanced microelectronic devices.

SUMMARY OF THE INVENTION

This invention relates to a composition useful for cleaning excess photoresist composition from the edge of the surface of a substrate coated with such a photoresist composition utilizing an edge bead remover (EBR), and thereby providing a substantially uniform film of the photoresist composition on the surface of the substrate. The present invention also relates to the cleaning method using such a composition for removing the excess of the photoresist composition film from the edge of the substrate surface, while simultaneously providing the photoresist film with a smooth edge. A solvent or mixture of solvents that will both efficiently and completely remove excess thick film photoresist (greater than 20–30 micrometers thick) from the edge of the surface of a substrate, to thereby provide a smooth edge and without damage or contamination thereof, is needed.

An EBR for thin photoresist films (less than about 20–30 micrometers thick) is almost always a good solvent for casting such thin films. However, an EBR for a thick film photoresist requires much more than just being a good solvent for the photoresist composition. Well known solvents for photoresists, such as cyclopentanone, propylene glycol methyl ether (PGME), propylene glycol methyl ether acetate (PGMEA), and mixtures of PGME and PGMEA are all good solvents for photoresists. However, they all have serious deficiencies when used as an EBR for such a thick film photoresist. The surface of wafers coated with a thick film photoresist, after using these EBR's, generally have stringers and poor coating track cleaning is achieved. The present invention seeks to solve the aforementioned disadvantages. In addition, in using an EBR in the production of microelectronic devices such as computer chips, it is also very advantageous that such a thick film EBR has extremely good volatility and it should not be used as the casting solvent for the thick film photoresist.

It has been found that solvent mixtures comprising a $di(C_1-C_3)$ alkyl carbonate such as dimethyl carbonate and diethyl carbonate, mixed with a compatible solvent such as cyclopentanone, provide very good EBR's for thick film photoresists. Although such dialkyl carbonate solvent mixtures can also be used as EBR's for thin film and moderately thick photoresist films, they find particular applicability for use with thick films having a film thickness greater than about 20–30 micrometers.

The present invention provides a method of treating a photoresist composition film disposed on a surface which method comprises contacting said photoresist composition with a solvent mixture, in an amount sufficient to produce a substantially uniform film thickness of said photoresist composition across said surface, wherein said solvent mixture comprises from about 50 to about 80 parts by weight, based on the weight of the solvent mixture, of at least one $di(C_1-C_3)$alkyl (dimethyl, diethyl, dipropyl) carbonate and from about 20 to about 50 parts by weight, based on the weight of the solvent mixture, of cyclopentanone. The dialkyl carbonate is preferably dimethyl carbonate and the ratio of dialkyl carbonate to cyclopentanone is preferably in the range of from about 80:20 to 50:50, more preferably from about 65:35 to 80:20, even more preferably from about 70:30 to 80:20, and most preferably about 75:25. The especially preferred method of the present invention further comprises rotating the surface having the photoresist composition film disposed thereon at a speed sufficient to thereby spread the photoresist composition film to the edge of the rotating surface, contacting the solvent mixture with the surface of the photoresist composition film solvent mixture while continuing to rotate said surface, and thereby providing a surface with the photoresist composition disposed as a film in having a substantially uniform thickness.

The present invention further provides an edge bead remover (EBR) for a photoresist composition disposed as a film on a surface, the EBR consisting essentially of a solvent mixture comprising from about 50 to about 80 parts by weight, based on the weight of the solvent mixture, of at least one $di(C_1-C_3)$alkyl carbonate and from about 20 to about 50 parts by weight, based on the weight of the solvent mixture, of cyclopentanone. The dialkyl carbonate is preferably dimethyl carbonate and the ratio of dialkyl carbonate to cyclopentanone is preferably in the range of from about 65:35 to 50:50, more preferably from about 65:25 to 80:20, and most preferably is about 75:25.

The following specific examples will provide detailed illustrations of the present invention. These examples are not intended, however, to limit the scope of the invention in any way and should not be construed as providing conditions, parameters or values that must be utilized to practice the present invention.

EXAMPLES

Comparative Example 1

A 4-inch Hexamethyldisilazane (HMDS) primed wafer was blown off with nitrogen for 3 seconds while the wafer was rotated at 500 RPM. 10 ml. of AZ® PLP™ 100 XT photoresist (Available from AZ Electronic Materials, Clariant Corp., Somerville, N. J.) was dispensed using a Flexi wafer coating track, over a period of 15 seconds, onto the surface of the static wafer. The wafer was then spun for 5 seconds at 400 RPM to spread the photoresist film to the edge of the wafer. The wafer was then spun for 40 seconds at 700 RPM, and then at 1200 RPM for 1 second, to provide a photoresist film thickness of about 50 micrometers (microns). About 35 ml. of AZ® 70/30 EBR (edge bead remover), consisting of 70 weight percent propylene glycol methyl ether (PGME) and 30 weight percent propylene glycol methyl ether acetate (PGMEA), was then dispensed over a period of 140 seconds onto the top outside edge and bottom of the wafer while the wafer was spun at 700 RPM. The static wafer was then dried for 40 seconds, and then soft baked for 60 seconds at 125° C. This EBR failed because a thin film of dissolved resist was spread over the cleaned track on the ring.

Comparative Example 2

An 8-inch HMDS primed silicon wafer was blown off with nitrogen for 4 seconds at 500 RPM. 10 ml. of AZ® PLP™ 100 XT photoresist was dispensed using a Flexi wafer coating track onto the surface of the static wafer over a period of 10 seconds. The coated wafer was then spun at 300 RPM for 10 seconds to spread the photoresist film to the edge of the wafer. The wafer was then spun at 2000 RPM for 1 second to provide a photoresist film thickness of about 50 micrometers. About 12 ml. of 100% cyclopentanone EBR was then dispensed over a period of 50 seconds while the wafer was spun at 500 RPM onto the top outside edge of the wafer. About 12 ml. of 100% cyclopentanone EBR was then dispensed onto the top outside edge and bottom of the wafer over a period of 50 seconds while the wafer was spun at 500 RPM. The wafer was then dried for 40 seconds at 300 RPM. This EBR failed because the coating track was not clean.

Example 3

An 8-inch HMDS primed silicon wafer was blown off with nitrogen for 4 seconds while the wafer was rotated at 500 RPM. 10 ml. of AZ® PLP™ 100 XT photoresist was dispensed using a Flexi wafer coating track, over a period of 10 seconds, onto the surface of the static wafer. The wafer was then spun for 10 seconds at 300 RPM to spread the photoresist film to the edge of the wafer. The wafer was then spun 2000 RPM for 1 second, to provide a photoresist film thickness of about 50 micrometers (microns). About 12 ml. of an EBR consisting of 75 weight percent dimethyl carbonate (DMC) and 25 weight cyclopentanone (CP), was then dispensed over a period of 50 seconds onto the top outside edge and bottom of the wafer while the wafer was spun at 500 RPM. Another 12 ml. of the EBR consisting of 75 weight percent dimethyl carbonate (DMC) and 25 weight cyclopentanone (CP), was then dispensed over a period of 50 seconds onto the bottom and outside top edge of the wafer while the wafer was spun at 500 RPM. The wafer was then dried for 50 seconds at 500 RPM and for 40 seconds at 300 RPM. This DMC/CP mixture functioned very well as an EBR. The coating track was clean and the resist edge was smooth.

Example 4

On the surface of each of eleven static 4-inch HMDS primed silicon wafers, 10 ml. of AZ® PLP™ 100 XT photoresist was dispensed onto the center of each wafer. Each wafer was then spun for 40 seconds at 700 RPM to spread the photoresist film to the edge of the wafer, to provide a photoresist film thickness of about 50 micrometers (microns). An EBR, as shown in the Table I below, was then dispensed onto the top outside edge of each wafer while the wafer was spun at 700 RPM, using a syringe at an EBR spray rate of about 0.5 ml./second, until the edge of each wafer was clean. Each wafer was then dried, without rotation, for 120 minutes at room temperature. The results for the different EBR's on eleven different wafers are shown in the Table I below.

TABLE I

| Solvent I | Wt. % I | Solvent II | Wt. % II | Cleared Edge | Resist Edge | Rating |
|---|---|---|---|---|---|---|
| DEC | 100 | — | 0 | Dirty | Jagged | Minus |
| DEC | 70 | PGMEA | 30 | Stringers | Jagged | Minus |
| DMC | 80 | Butyl Acetate | 20 | Dirty | Rough | Minus |
| DMC | 100 | — | 0 | Dirty | Smooth | Minus |
| DMC | 95 | Cyclopentanone | 05 | Dirty | Smooth | Minus |
| DMC | 90 | Cyclopentanone | 10 | Dirty | Smooth | Minus |
| DMC | 85 | Cyclopentanone | 15 | Trace/more | Smooth | Minus |
| DMC | 80 | Cyclopentanone | 20 | Trace | Smooth | Zero |
| DMC | 75 | Cyclopentanone | 25 | Clean | Smooth | Plus |
| DMC | 60 | Cyclopentanone | 40 | Trace | Smooth | Zero |
| DMC | 50 | Cyclopentanone | 50 | Trace | Smooth | Zero |

| Resist Edge | Cleared Edge | Rating |
|---|---|---|
| Smooth/Almost Smooth | Clean | Plus |
| Smooth/Almost Smooth | Trace Dirt | Zero |
| Jagged/Rough | Dirty | Minus |
| Jagged/Rough | Stringers | Minus |
| Smooth | Dirty | Minus |

Example 5

On the surface of each of six 4-inch HMDS primed silicon wafers 10 ml. of AZ® PLP™ 100 XT photoresist was dispensed onto the center. Each wafer was then spun for 40 seconds at 700 RPM to spread the photoresist film to the edge of the wafer, to provide a photoresist film thickness of about 50 micrometers (microns). An EBR, as shown in the Table II below, was then dispensed onto the top outside edge of each wafer, while the wafer was spun at 700 RPM, using a syringe at an EBR spray rate of about 0.5 ml./second over a period of 10 seconds. Each static wafer was then dried for 120 minutes at room temperature. The results for six different EBR's on six different wafers are shown in the Table II below.

TABLE II

| Solvent I | Wt. % I | Solvent II | Wt. % II | Cleared Edge | Resist Edge | Rating |
|---|---|---|---|---|---|---|
| DEC | 100 | — | 0 | Not Clean | Flow | Minus |
| DEC | 70 | PGMEA | 30 | Not Clean | Flow | Minus |
| DMC | 80 | Butyl Acetate | 20 | Flowed | Rough | Minus |
| DMC | 100 | — | 0 | Not Clean | Flow | Minus |
| DMC | 75 | Cyclo-pentanone | 25 | Clean | Smooth | Plus |
| DMC | 50 | Cyclo-pentanone | 50 | Trace | Smooth | Zero |

Example 6

On the surface of each static four 4-inch HMDS primed silicon wafers 10 ml. of AZ® PLP™ 100 XT photoresist was dispensed onto the center of each wafer. Each wafer was then spun for about 20 seconds at 1400 RPM to spread the photoresist film to the edge of the wafer. This high rotational speed simulated the centrifugal forces that affect the EBR on much larger diameter wafers. About 10 ml. of an EBR, as shown in the Table III below, was then dispensed using a syringe at an EBR spray rate of about 0.5 ml./second over a period of about 20 seconds onto the top outside edge of each wafer while the wafer was spun at 1400 RPM. Each static wafer was then dried for about 120 minutes at room temperature. The results for four different EBR's on four different wafers are shown in the Table III below.

TABLE III

| Solvent I | Wt. % I | Solvent II | Wt. % II | Cleared Edge | Resist Edge | Rating |
|---|---|---|---|---|---|---|
| Cyclo-pentanone | 90 | Dioxolane | 10 | Flow | Rough | Minus |
| Cyclo-pentanone | 25 | DMC | 75 | Clean | Smooth | Plus |
| Cyclo-pentanone | 100 | — | 0 | Stringers | Rough | Minus |
| Cyclo-hexanone | 28 | DMC | 72 | Not Clean | Smooth | Minus |

Example 7

Three 4-inch HMDS primed silicon wafers were each blown off with nitrogen for 3 seconds while the wafer was rotated at 500 RPM. AZ® PLP™ 100 XT photoresist (10 ml) was dispensed onto each static wafer using a Flexi track coater, over a period of 15 seconds. Each wafer was then spun for 20 seconds at 1100 RPM to spread the photoresist film to the edge of the wafer, to provide a photoresist film thickness of about 60 micrometers (microns). An EBR, as shown in the Table IV below, was then dispensed onto the top outside edge of each wafer while the wafer was spun at 300 RPM, EBR spray rate of about 0.25 ml./second over a period of 81 seconds. The same EBR was then dispensed in the same manner onto the bottom wafer for 15 seconds while the wafer was spun at 300 RPM. Each wafer was then dried for 30 seconds at 300 RPM, and then soft baked for 380 seconds at 120° C. The results for three different EBR's on three different wafers are shown in the Table IV below.

TABLE IV

| Solvent I | Wt. % I | Solvent II | Wt. % II | Cleared Edge | Resist Edge | Rating |
|---|---|---|---|---|---|---|
| Cyclo-pentanone | 50 | DMC | 50 | Flow | Rough | Minus |
| Cyclo-pentanone | 25 | DMC | 75 | Clean | Smooth | Plus |
| Cyclo-pentanone | 75 | DMC | 25 | Clean | Smooth | Plus |

Unless otherwise stated, all parts and percentages are by weight, and all temperatures are in degrees Centigrade. A static wafer is one that is not being rotated or spun.

Example 8

On the surface of two static 4-inch HMDS primed silicon wafers 10 ml. of AZ® PLP™ 100 XT photoresist was dispensed onto the center of the surface of each wafer. Each wafer was then spun for 40 seconds at 700 RPM to spread the photoresist film to the edge of the wafer, to provide a photoresist film thickness of about 50 micrometers (microns). An EBR, as shown in the Table V below, was then dispensed onto the top of each wafer, while the wafer was spun at 700 RPM, using a syringe at an EBR spray rate of about 0.5 ml./second over a period of about 15 seconds. Each static wafer was then dried for 120 minutes seconds at room temperature. The results for four different EBR's on four different wafers are shown in the Table V below.

TABLE V

| Solvent I | Wt. % I | Solvent II | Wt. % II | Cleared Edge | Resist Edge | Rating |
|---|---|---|---|---|---|---|
| DEC | 100 | — | 0 | Dirty | Jagged | Minus |
| DEC | 50 | Cyclo-pentanone | 50 | Clean | Rough | Minus |
| DEC | 70 | Cyclo-pentanone | 30 | Trace | Smooth | Plus |

Having described our invention, what we desire to claim is:

1. A method of treating a photoresist composition film disposed on a surface which method comprises contacting said photoresist composition with a solvent mixture, in an amount sufficient to produce a substantially uniform film thickness of said photoresist composition across said surface, wherein said solvent mixture comprises from about 50 to about 80 parts by weight, based on the weight of the solvent mixture, of at least one di($C_1$–$C_3$)alkyl carbonate and from about 20 to about 50 parts by weight, based on the weight of the solvent mixture, of cyclopentanone.

2. The method of claim 1 wherein said dialkyl carbonate is dimethyl carbonate.

3. The method of claim 1 wherein the ratio of dialkyl carbonate to cyclopentanone is in the range of from about 65:35 to 80:20.

4. The method of claim 1 wherein the ratio of dialkyl carbonate to cyclopentanone is from about 70:30 to 80:20.

5. The method of claim 1 wherein the ratio of dialkyl carbonate to cyclopentanone is about 75:25.

6. The method of claim 1, comprising rotating the surface having the photoresist composition film disposed thereon at a speed sufficient to thereby spread the photoresist composition film to the edge of the rotating surface, and contacting the solvent mixture with the surface of the photoresist composition film while continuing to rotate said surface, thereby providing a surface with the photoresist composition disposed as a film having a substantially uniform thickness.

7. An edge bead remover for a photoresist composition disposed as a film on a surface, consisting essentially of a solvent mixture comprising from about 50 to about 80 parts by weight, based on the weight of the solvent mixture, of at least one di($C_1$–$C_3$)alkyl carbonate and from about 20 to about 50 parts by weight, based on the weight of the solvent mixture, of cyclopentanone.

8. The solvent mixture of claim 7 wherein said dialkyl carbonate is dimethyl carbonate.

9. The solvent mixture of claim 7 wherein the ratio of dialkyl carbonate to cyclopentanone is in the range of from about 65:35 to 80:20.

10. The solvent mixture of claim 7 wherein the ratio of dialkyl carbonate to cyclopentanone is from about 70:30 to 80:20.

11. The solvent mixture of claim 7 wherein the ratio of dialkyl carbonate to cyclopentanone is about 75:25.

12. A method of treating a thick film photoresist composition disposed on a surface which method Comprises contacting said thick film photoresist composition having a film thickness greater than 20 micrometers with a solvent mixture, in an amount sufficient to produce a substantially uniform film thickness of said photoresist composition across said surface, wherein said solvent mixture comprises from about 50 to about 80 parts by weight, based on the weight of the solvent mixture, of at least one di($C_1$–$C_3$)alkyl carbonate and from a 20 to about 50 parts by weight, based on the weight of the solvent mixture, of cyclopentanone.

13. The method of claim 12, wherein the thick film photoresist composition has a film thickness greater than 30 micrometers.

14. The method of claim 12 wherein said dialkyl carbonate is dimethyl carbonate.

15. The method of claim 12 wherein the ratio of dialkyl carbonate to cyclopentanone is in the range of from about 65:35 to 80:20.

16. The method of claim 12 wherein the ratio of dialkyl carbonate to cyclopentanone is from about 70:30 to 80:20.

17. The method of claim 12 wherein the ratio of dialkyl carbonate to cyclopentanone is about 75:25.

18. The method of claim 12, comprising rotating the surface having the photoresist composition film disposed thereon at a speed sufficient to thereby spread the photoresist composition film to the edge of the rotating surface, and contacting the solvent mixture with the surface of the photoresist composition while continuing to rotate said surface, thereby providing a surface with the photoresist composition disposed as a film having a substantially uniform thickness.

* * * * *